United States Patent
Koganei

(10) Patent No.: US 6,333,236 B1
(45) Date of Patent: Dec. 25, 2001

(54) SEMICONDUCTOR DEVICE AND METHOD FOR MANUFACTURING SAME

(75) Inventor: Hirosada Koganei, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/598,478

(22) Filed: Jun. 22, 2000

(30) Foreign Application Priority Data

Jun. 22, 1999 (JP) .................................................. 11-174893

(51) Int. Cl.⁷ .................................................. H01L 21/331
(52) U.S. Cl. .................................................. 438/312; 257/197
(58) Field of Search .................................................. 438/312

(56) References Cited

U.S. PATENT DOCUMENTS

| | | | |
|---|---|---|---|
| 5,323,030 | * 6/1994 | Koscica et al. | 257/195 |
| 5,419,808 | * 5/1995 | Kitano | 156/656.1 |
| 5,436,193 | * 7/1995 | Beernink et al. | 437/129 |
| 6,159,816 | * 12/2000 | Hill et al. | 438/309 |

FOREIGN PATENT DOCUMENTS

| | | |
|---|---|---|
| 63-90848 | 4/1988 | (JP) . |
| 2-109360 | 4/1990 | (JP) . |
| 3-60178 | 9/1991 | (JP) . |
| 6-12778 | 2/1994 | (JP) . |
| 2558937 | 9/1996 | (JP) . |
| 9-306889 | 11/1997 | (JP) . |
| 2770587 | 4/1998 | (JP) . |

* cited by examiner

Primary Examiner—Olik Chaudhuri
Assistant Examiner—Douglas A. Wille
(74) Attorney, Agent, or Firm—McGinn & Gibb, PLLC

(57) ABSTRACT

In a hetero-junction bipolar transistor, an undoped $Al_{0.7}Ga_{0.3}As$ stopper layer 5 having good etching controllability is provided on a base layer 4, thereby forming a base without etching damage, this resulting in achievement of the desired base resistance with good repeatability.

3 Claims, 7 Drawing Sheets

(a)

(b)

FOR SELECTIVE ETCHING OF $Al_{0.2}Ga_{0.8}As$ FOR $Al_{0.7}Ga_{0.3}As$, A MIXTURE RATIO IN THE RANGE 1 IS USED.

FOR SELECTIVE ETCHING OF GaAs FOR $Al_{0.2}Ga_{0.8}As$, A MIXTURE RATIO IN THE RANGE 2 IS USED.

(a)

(b)

(a)

(b)

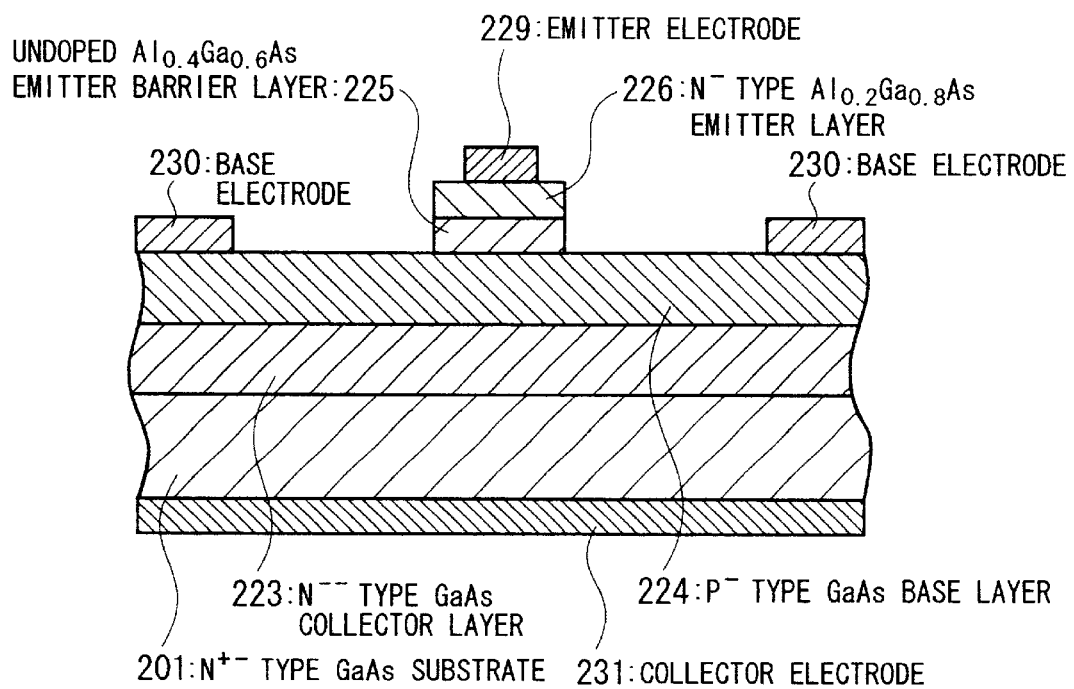

SEMICONDUCTOR DEVICE AND METHOD FOR MANUFACTURING SAME

BACKGROUND OF THE INVENTION

1. Field of the Invention

The present invention relates to a transistor having a hetero-junction, and more particularly to a semiconductor device that enables the achievement of a base having the desired resistance and good repeatability, and to a method for manufacturing such a semiconductor device.

2. Related Art

A method for manufacturing a bipolar transistor having an AlGaAs or GaAs hetero junction in the prior art is described with reference made to FIG. 5 and FIG. 6.

On a GaAs substrate 101 a first n-type GaAs layer 102 of 500 nm thickness, a second n-type GaAs layer 103 of 500 nm thickness, a p-type GaAs layer 104 of 50 nm thickness, an n-type $Al_{0.2}Ga_{0.8}As$ layer 106 of 30 nm thickness, and a third n-type GaAs layer 107 of 20 nm thickness are sequentially grown, using an MOCVD (metal organic chemical vapor deposition) or MBE (molecular beam epitaxy) process. The doping of each layer is made so as to enable functioning as a device. Next, a photolithographic process is used to form a photoresist layer 108 having a dimension of approximately 0.8 μm thickness (FIG. 5(a)).

Next, using a gas mixture of, for example, $SF_6$ and $BCl_3$, selective dry etching is done so as to etch the third GaAs layer 107, thereby forming an n-type GaAs emitter contact layer 127. When this is done, etching is stopped at the surface of the n-type $Al_{0.2}Ga_{0.8}As$ layer 106 (FIG. 5(b))

Next, sulfuric acid and hydrogen peroxide or the like are used to perform wet etching of the n-type $Al_{0.2}Ga_{0.8}As$ layer 106, and expose the surface of the p-type GaAs layer 104 (FIG. 6(a)). When this is done, an etching rate of the n-type $Al_{0.2}Ga_{0.8}As$ layer 106 is equal to that of the p-type GaAs layer 104, so that the amount of etching of the n-type $Al_{0.2}Ga_{0.8}As$ layer 106 is controlled by the etching time, and part of the p-type GaAs layer 104 is etched in the process. Additionally, because this is anisotropic etching, variations occur in the emitter dimensions.

In the case in which the above-noted etching shown in FIG. 5(b) and FIG. 6(a), the overall etching time becomes long, and fine control of the emitter dimensions becomes difficult. Therefore, there is a need to perform separate etching of the n-type $Al_{0.2}Ga_{0.8}As$ layer 106 and the p-type GaAs layer 104 and, thereby causing an increase in the number of process steps.

Finally, an n-type GaAs sub-collector layer 122, an n-type GaAs collector layer 123, a p-type GaAs base layer 124, an emitter electrode 129, a base electrode 130, and a collector electrode 131 are formed using conventional processes, thereby fabricating the transistor (FIG. 6(b)).

The second prior art example shown in FIG. 7 is a transistor that is disclosed in the Japanese Examined Patent Publication (KOKOKU) No.6-12778.

In the hetero-bipolar transistor shown in FIG. 7, an $n^{--}$ type GaAs collector layer 223 with a donor concentration of $1 \times 10^{16}$ atoms/cm$^3$, a p⁻ type GaAs base layer 224 with an acceptor concentration of $1 \times 10^{18}$ atoms/cm$^3$, an undoped $Al_{0.4}Ga_{0.6}As$ emitter barrier layer 225 of thickness 10 nm, and an n⁻ type $Al_{0.2}Ga_{0.8}As$ emitter layer 226 with a donor concentration of $5 \times 10^{17}$ atoms/cm$^3$ are formed onto an $n^{+-}$ type GaAs substrate 201 having a donor concentration of $1 \times 10^{18}$ atoms/cm$^3$. In this drawing, the reference numeral 231 denotes a collector electrode, the reference numeral 230 is a base electrode, and the reference numeral 229 is an emitter electrode.

In this prior art example, carriers which are injected into the base layer 224 from the emitter layer 226, passing through the emitter barrier 225, are accelerated by the band discontinuity between the emitter barrier 225 and the base layer 224, so as to pass through the base layer 224 at a high speed, thereby enabling ultra-highspeed operation.

As described above, in the first prior art example, when removing the emitter layer, the base layer is also etched. Therefore, there is an increase in the resistance of the base region and the occurrence of variations of the base resistance. Additionally, because it is difficult to control emitter dimension, there is the added problem of the occurrence of variations of the emitter current value.

In the second prior art example as shown in FIG. 7, a thin undoped $Al_{0.4}Ga_{0.6}As$ emitter barrier layer 225 is sandwiched between an $Al_{0.2}Ga_{0.8}As$ emitter layer 226 and a GaAs base layer 224, however, it is impossible to use an undoped $Al_{0.4}Ga_{0.6}As$ emitter barrier layer 225 as an etching stopper, therefore, it is impossible to achieve selective etching of the $Al_{0.2}Ga_{0.8}As$ emitter layer 226 with respect to the undoped $Al_{0.4}Ga_{0.6}As$ emitter barrier layer 225. Thus, this structure has the same drawback as that of the first prior art example.

Accordingly, it is an object of the present invention to provide a bipolar transistor having a hetero-junction, in which patterning of an emitter layer does not affect the dimension of the base layer therebelow, thereby preventing an increase in the resistance of the base layer, and also in which dimensional control of the emitter is facilitated. It is a further object of the present invention to provide a method for manufacturing the above-noted semiconductor device.

SUMMARY OF THE INVENTION

In order to achieve the above-noted objects, the present invention has the following technical constitution.

Specially, the first aspect of the present invention is a hetero-junction bipolar transistor comprising, an n-type GaAs sub-collector layer formed on a semi-insulating GaAs substrate, an n-type GaAs collector layer formed on the n-type GaAs sub-collector layer, a p-type base layer formed on the n-type GaAs collector layer, an undoped $Al_xGa_{1-x}As$ stopper layer formed on the p-type base layer, an n-type $Al_yGa_{1-y}YAs$ emitter layer formed on the undoped $Al_xGa_{1-x}As$ stopper layer, and an n-type GaAs emitter contact layer formed on the n-type $Al_yGa_{1-y}As$ emitter layer, wherein the value Y in said n-type $Al_yGa_{1-y}As$ emitter layer is 0 to 0.4, and the value X in said undoped $Al_xGa_{1-x}As$ stopper layer is 0.7 to 1.0.

In the second aspect of the present invention, the n-type GaAs emitter contact layer is replaced with $In_zGa_{1-z}As$ having a value Z of 0 to 0.5.

The third aspect of the present invention is a method for fabricating a hetero-junction bipolar transistor comprising the steps of: a first step of forming an n-type GaAs sub-collector layer, an n-type GaAs collector layer, a p-type GaAs base layer, an undoped $Al_xGa_{1-x}As$ stopper layer with a value X of 0.7 to 1.0, an n-type $Al_yGa_{1-y}As$ emitter layer with a value Y of 0 to 0.4, an n-type GaAs emitter contact layer on a semi-insulating GaAs substrate in this sequence; a second step of forming a resist layer on the n-type GaAs emitter contact layer and patterning the resist layer; a third step of etching the n-type GaAs emitter contact layer and the n-type $Al_yGa_{1-y}As$ emitter layer using the resist layer and a first etching fluid with the undoped $Al_xGa_{1-x}As$ stopper layer as an etching stopper, so as to form an n-type GaAs emitter contact and an n-type $Al_yGa_{1-y}As$ emitter, and expose a surface of the undoped $Al_xGa_{1-x}As$ stopper layer; and a fourth step of removing the exposed undoped $Al_xGa_{1-x}As$ stopper layer so as to expose a surface of the p-type GaAs base layer using a second etching fluid.

In the fourth aspect of the present invention, the first etching fluid is a mixture of a citric acid aqueous solution and hydrogen peroxide aqueous solution, and when a concentration of the hydrogen peroxide aqueous solution is 28 to 32 percent by weight, and a concentration of the citric acid aqueous solution is 20 to 50 percent by weight, the mixture ratio of the citric acid aqueous solution for the hydrogen peroxide aqueous solution is in the range from 2.0 to 6.0.

In the fifth aspect of the present invention, the second etching fluid is either hydrochloric acid or buffered fluoric acid.

BRIEF DESCRIPTIONS OF THE DRAWINGS

FIG. 1(a) and FIG. 1(b) are cross-sectional views showing the manufacturing process steps of a semiconductor device according to an embodiment the present invention.

FIG. 2(a) and FIG. 2(b) are cross-sectional views showing the steps following those shown in FIG. 1.

FIG. 5(a) and FIG. 5(b) are cross-sectional views showing the manufacturing process steps for a semiconductor device according to the first prior art example.

Figure 5:
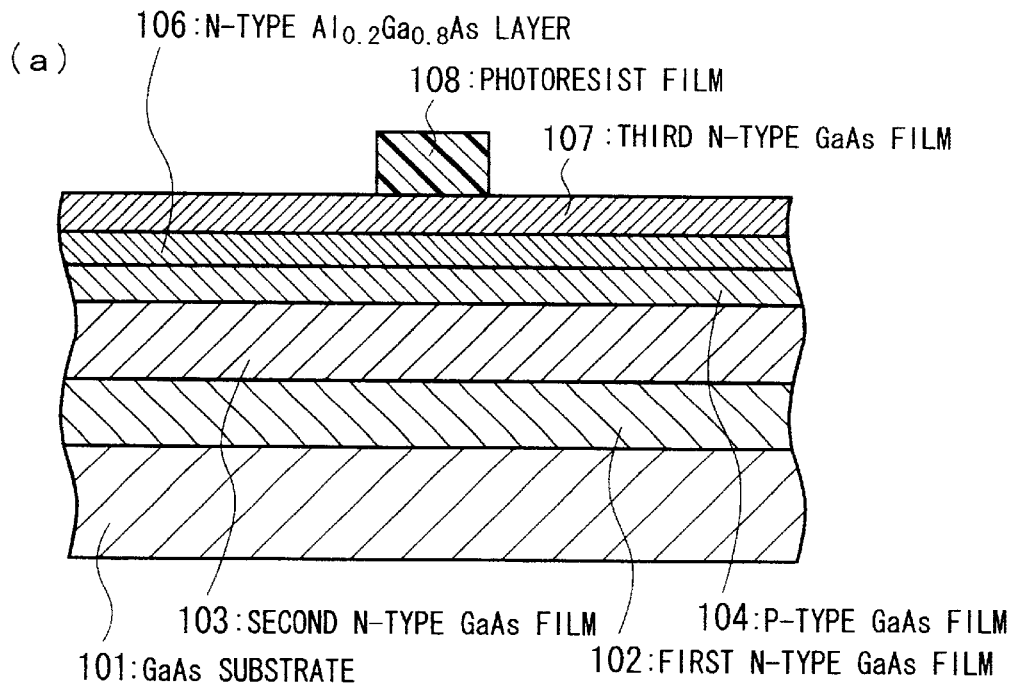
Figure 5:
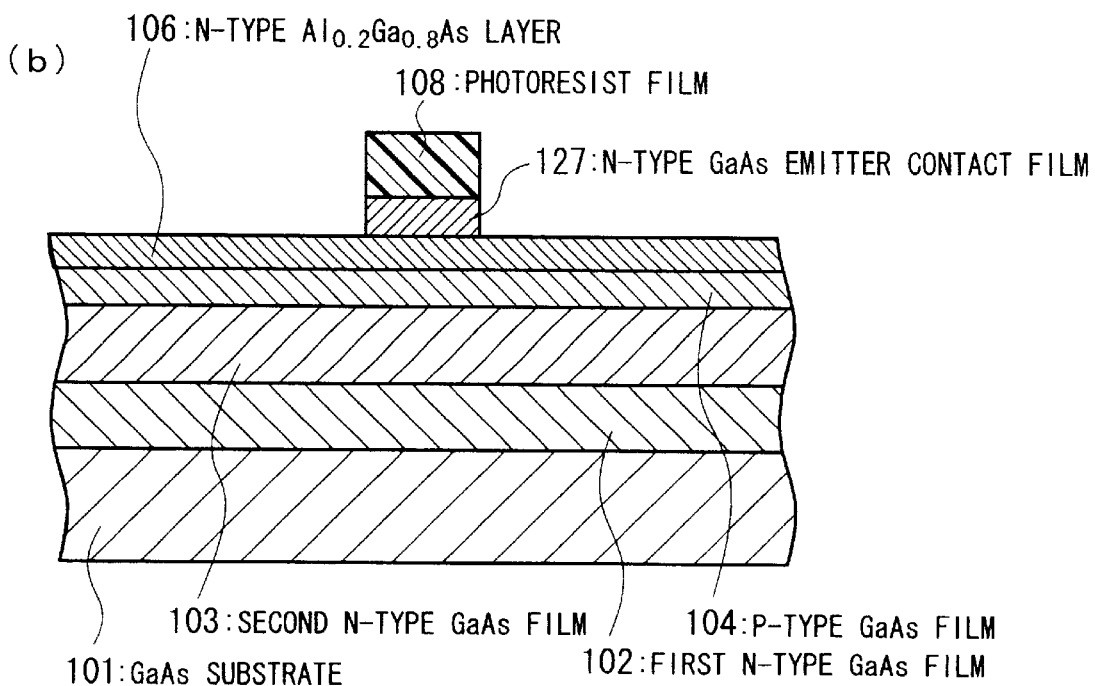
Figure 6:
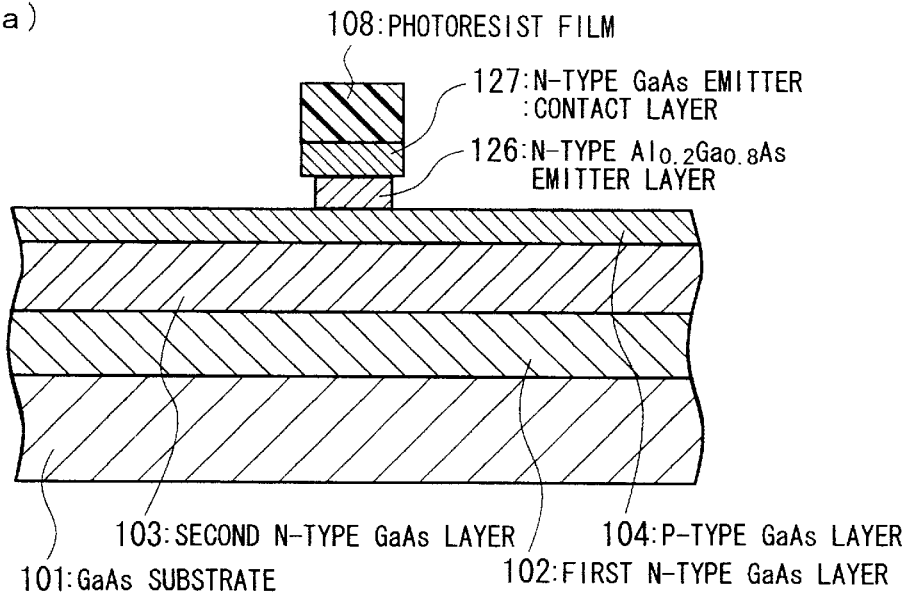
Figure 6:
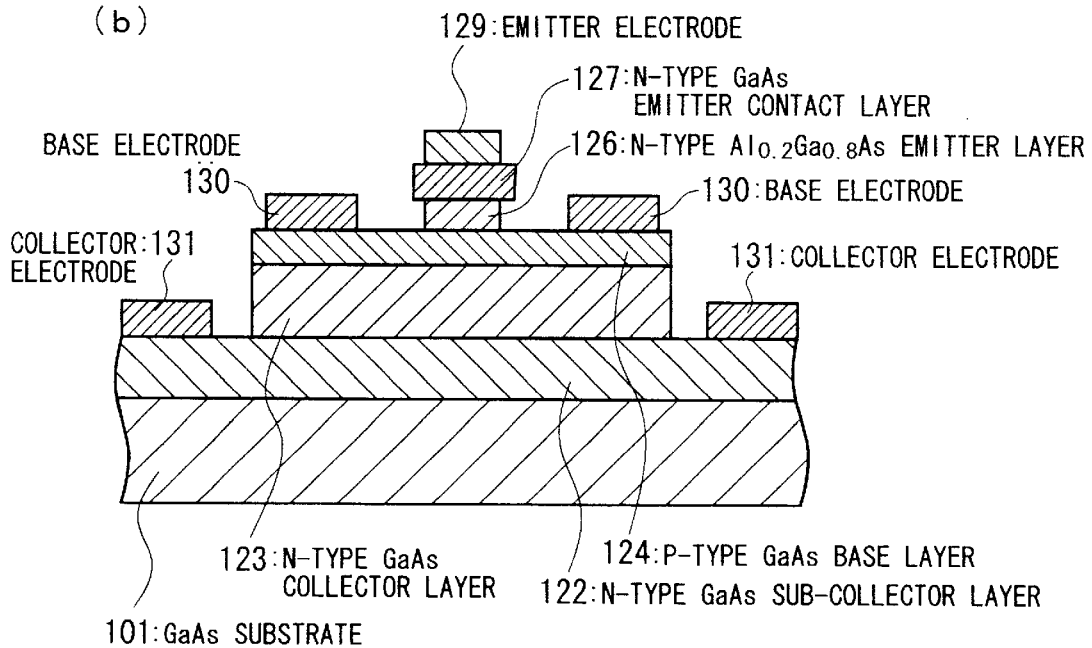

FIG. 6(a) and FIG. 6(b) are cross-sectional views showing the steps following those shown in FIG. 5.

FIG. 7 is a cross-sectional view showing a semiconductor device according to the second prior art example.

DETAILED DESCRIPTION OF THE PREFERRED EMBODIMENTS

Figure 1:
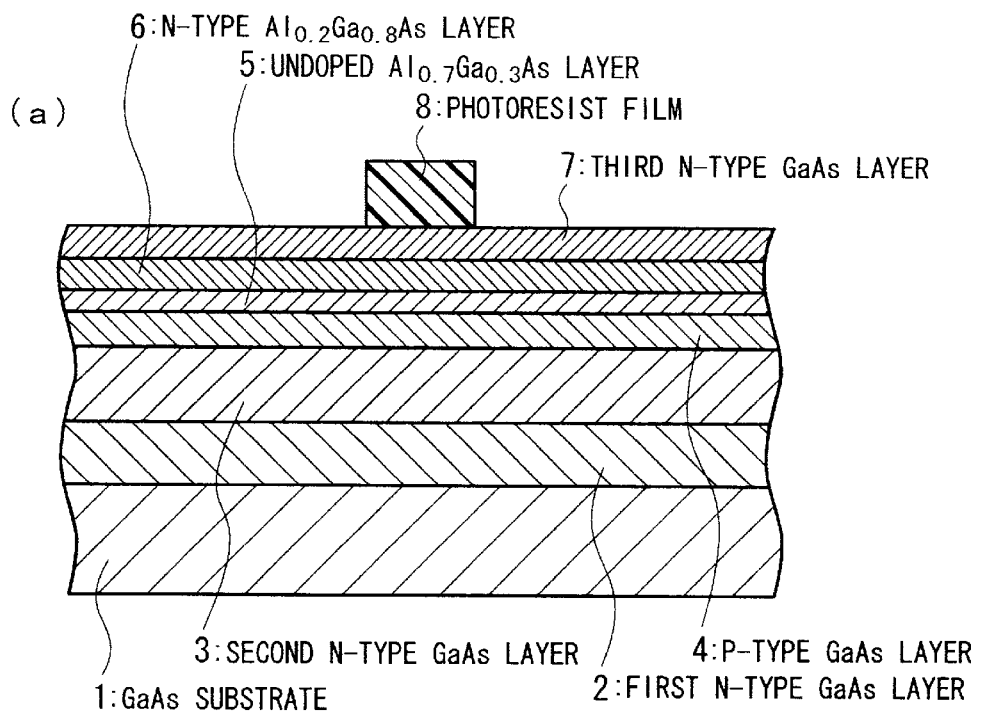
Figure 1:
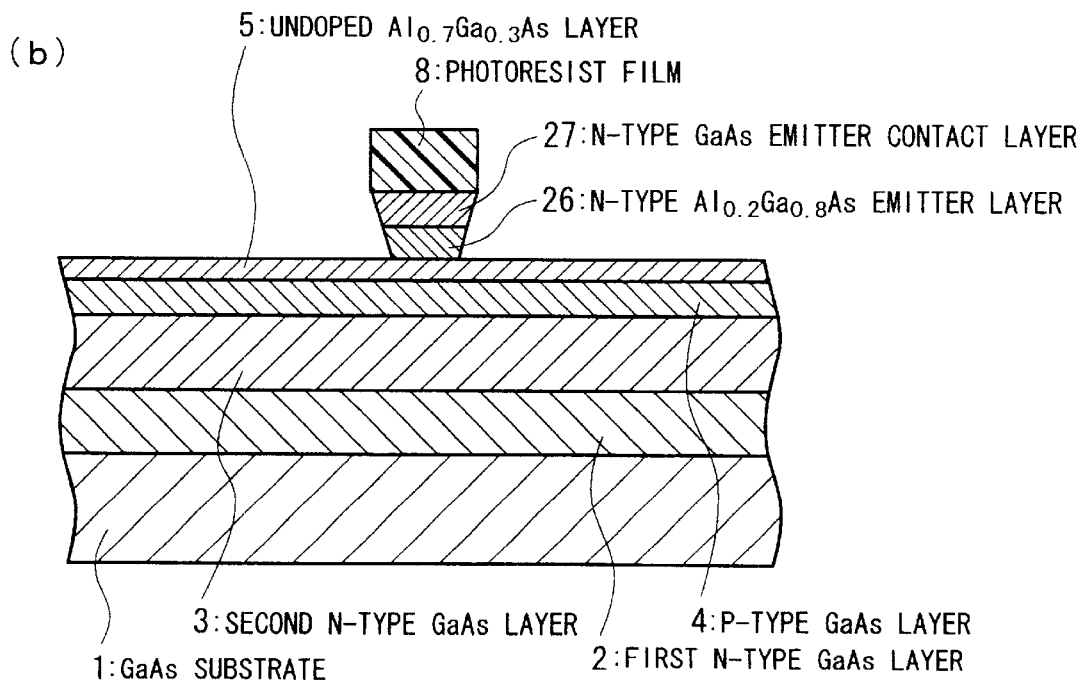
Figure 2:
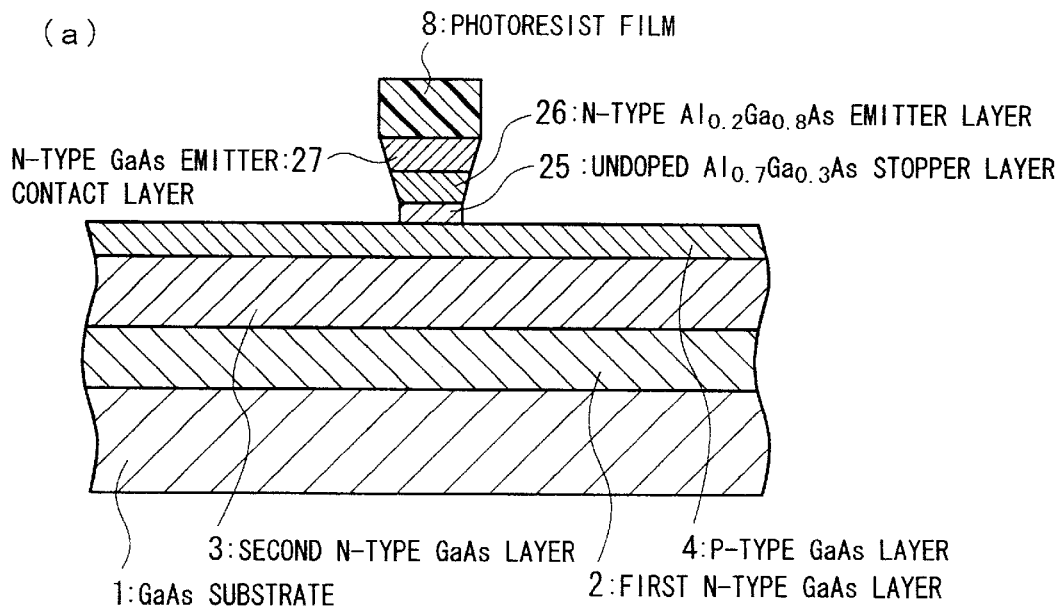
Figure 2:
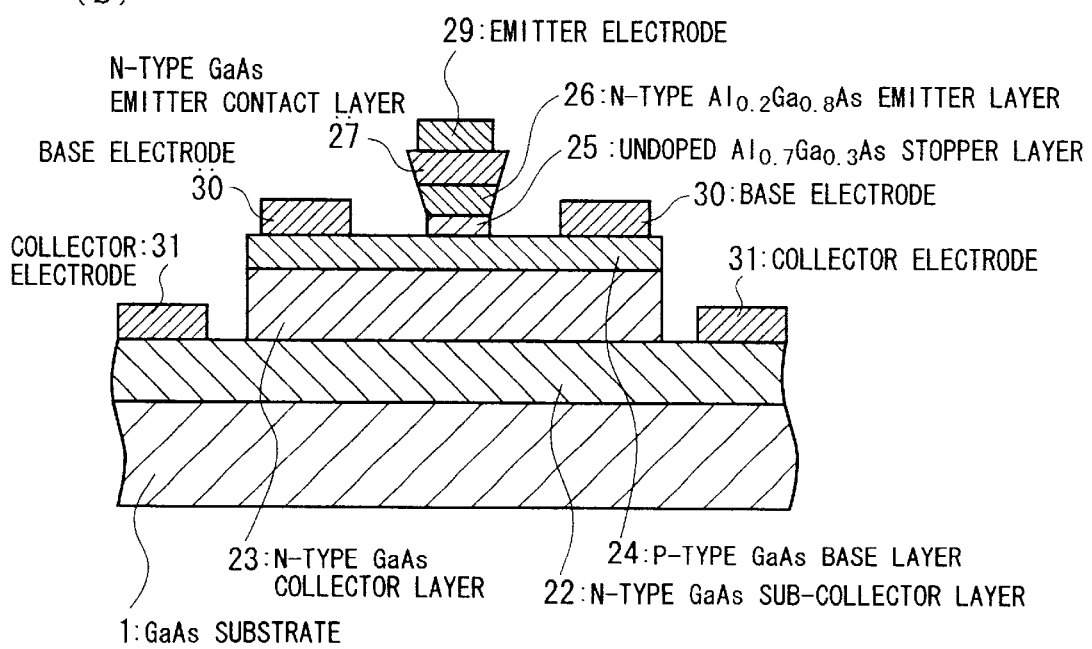

Embodiments of the present invention are described in detail below, with references made to relevant accompanying drawings. FIG. 1 and FIG. 2 show the manufacturing process steps for an embodiment of the present invention.

First MOCVD (metal organic chemical vapor deposition) or MBE (molecular beam epitaxy) process is used to sequentially grow a first n-type GaAs layer 2 having a thickness of 500 nm, a second n-type GaAs layer 3 having a thickness of 500 nm, a p-type GaAs layer 4 having a thickness 50 nm, an undoped $Al_{0.7}Ga_{0.3}As$ layer 5 having a thickness of 2 nm, an n-type $Al_{0.2}Ga_{0.8}As$ layer 6 having a thickness of 30 nm, and a third n-type GaAs layer 7 having a thickness of 20 nm onto a GaAs substrate 1, The doping concentration of each layer is arbitrarily established so as to achieve the function of the device. Next, a photolithographic process is used to form a photoresist film 8 having a thickness of approximately 4 μm (FIG. 1(a)).

Next, using the photoresist film 8 as a mask, a mixed etching fluid made up of citric acid aqueous solution and hydrogen peroxide aqueous solution is used to etch the third n-type GaAs layer 7 and the n-type $Al_{0.2}Ga_{0.9}As$ layer 6 (FIG. 1(b)). When etching the third n-type GaAs layer 7 and the n-type $Al_{0.2}Ga_{0.8}As$ layer 6 using a mixture of citric acid aqueous solution and hydrogen peroxide aqueous solution, the undoped $Al_{0.7}Ga_{0.3}As$ layer 5 acts as an etching stopper layer.

If an $Al_xGa_{1-x}As$ layer having an aluminum composition such that X=0.7 or greater is used as the etching stopper layer, the above-mentioned $Al_xGa_{1-x}As$ layer acts as the etching stopper, even if this etching stopper layer is doped with an impurity or undoped. In order to impart the function of an etching stopper to this layer, it is necessary to make the layer thick, however it is necessary to make the layer thin in order to achieve a low resistance. The ideal thickness for the case of $Al_{0.7}Ga_{0.3}As$, is 1.5 to 3.0 nm. For the case of AlAs, it is possible to make the thickness 1.0 to 2.0 nm. Even if the n-type $Al_{0.2}Ga_{0.8}As$ layer 6 and the third n-type GaAs layer 7 are $Al_xGa_{1-x}As$ having a value X of 0 to approximately 0.4 and $In_xGa_{1-x}As$ having a value X of 0 to 0.5, respectively, it is possible to perform selective etching of $Al_xGa_{1-x}As$ with respect to the $Al_{0.7}Ga_{0.3}As$ beneath the $Al_xGa_{1-x}As$.

Figure 3:
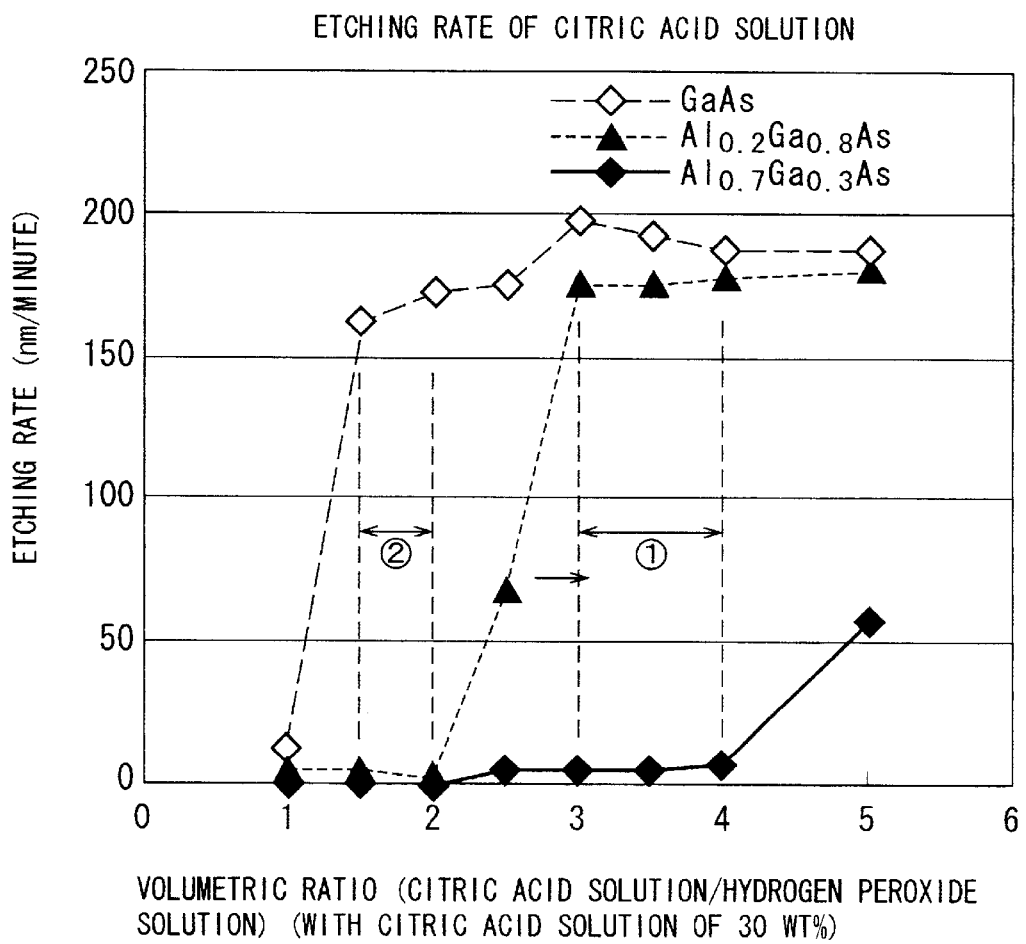
FIG. 3 is a graph showing the composition dependency characteristics of etching rate of the etching fluid used in the method for manufacturing a semiconductor device according to an embodiment the present invention.
Figure 4:
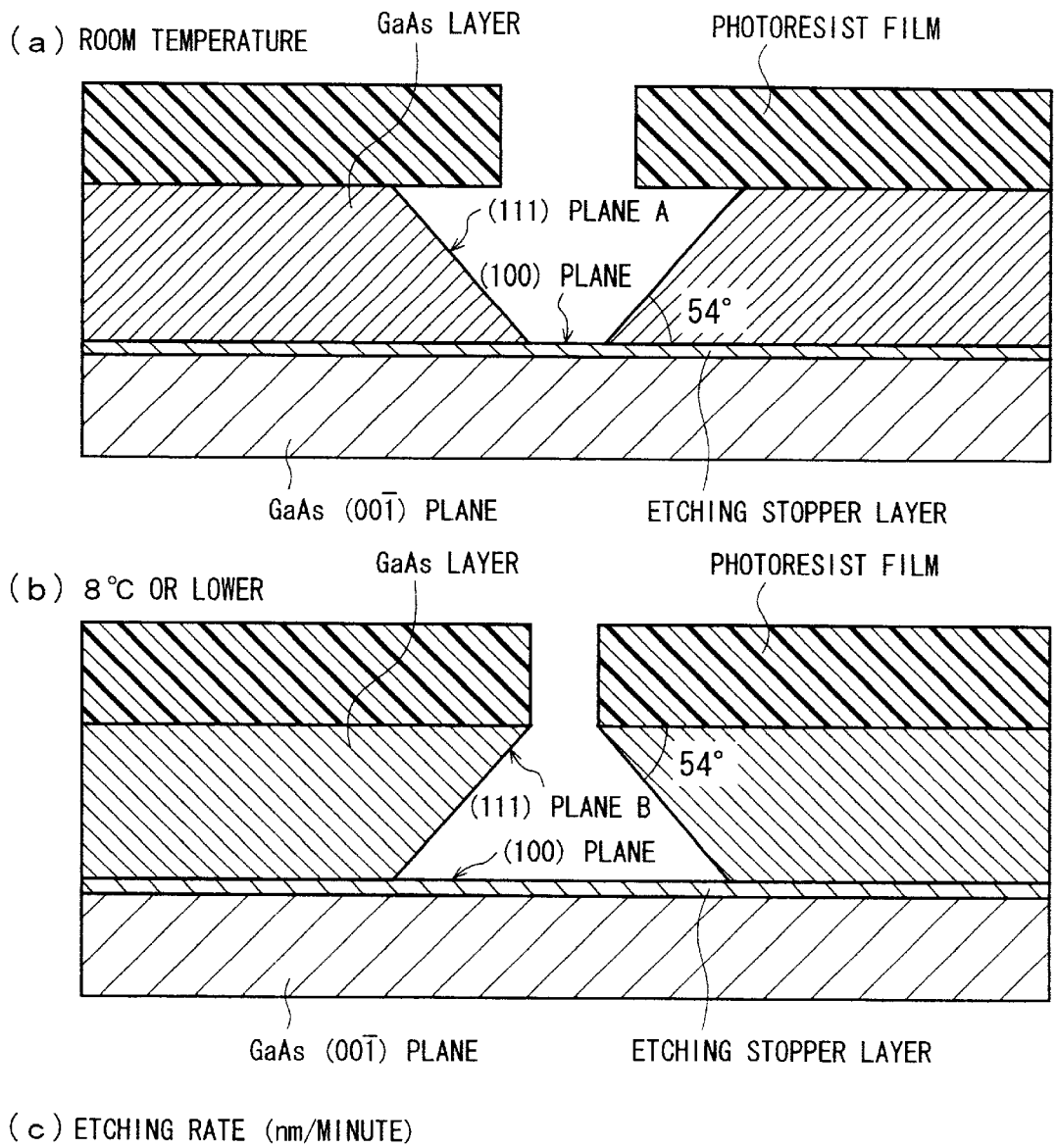
FIG. 4(a) is cross-sectional view showing the GaAs etching rate and etching shape in a room temperature.
FIG 4(b) is cross-sectional view showing the GaAs etching rate and etching shape below 8° C.
FIG. 4(c) is a table showing the actual GaAs etching rate depending upon etching temperature and crystal plane direction.

As shown in FIG. 3, it is desirable that the mixture ratio between the citric acid solution and the hydrogen peroxide solution, that is, citric acid solution (30 wt %)/hydrogen peroxide solution (30 wt %) is 3.0 to 4.0. The third n-type GaAs layer 7 and the n-type $Al_{0.2}Ga_{0.8}As$ layer 6 are etched at substantially the same etching rate. After removal of the n-type $Al_{0.2}Ga_{0.8}As$ layer 6, this etching is stopped on the undoped $Al_{0.7}Ga_{0.3}As$ layer 5. As shown in FIG. 4, this etching method, as disclosed in Japanese Patent Application No. 8-125049, is one in which GaAs exhibits a different etching rate, depending upon the etching fluid temperature and crystal plane direction, so that the etching performed is anisotropic. Therefore, side etching of the third n-type GaAs layer 7 and the n-type $Al_{0.2}Ga_{0.8}As$ layer 6 does not progress, so that a shape having a constant taper angle is obtained, the dimensions of the n-type $Al_{0.2}Ga_{0.8}As$ emitter layer 26 is established by dimension of the photoresist 8 mask, regardless of the overetching time.

The selective etching mechanism for the wet etching used in the above-noted embodiment is described below, with reference made to FIG. 3. This etching is performed with oxidation of the crystal surface caused by the hydrogen peroxide solution and the removal of the oxide layer by the citric acid solution. Because it is difficult to etch the aluminum oxide, the greater the aluminum content, the lower is the etching rate. If the amount of hydrogen peroxide in the mixed fluid increases (left side of the graph), oxidation of aluminum becomes the major factor, and the etching rate decreases, while if the amount of citric acid increases, (right side of the graph), the etching of the aluminum becomes the major factor, and the etching rate of the $Al_xGa_{1-x}As$ becomes substantially the same rate as GaAs. The switch over (sudden increase) of etching rate accompanying an increase in the amount of citric acid moves further to the right of the graph as the amount of aluminum increases.

Additionally, with regard to the influence of the amount of citric acid in the citric acid solution and the amount hydrogen peroxide in the hydrogen peroxide solution on the selective etching, in the case in which the concentration of the citric acid solution is lower than 30 wt %, by reducing the amount of hydrogen peroxide with respect to the amount of water, it becomes difficult for an oxide layer to form, so that it is difficult to obtain good selectivity. In this case, by increasing the amount of hydrogen peroxide, it is possible to perform selective etching. For example, for a citric acid solution concentration of 20 wt %, by establishing a ratio between 20 wt % citric acid solution and 30 wt % hydrogen peroxide solution of 5:1 to 6:1, it is possible to perform selective etching between $Al_{0.2}Ga_{0.8}As$ and $Al_{0.7}Ga_{0.3}As$.

On the other hand, in the case in which the concentration of the citric acid solution is greater than 30 wt %, by increasing the amount of hydrogen peroxide with respect to the amount of water, it becomes easy to form an aluminum oxide layer, so that etching becomes difficult. In this case, by decreasing the ratio of hydrogen peroxide, etching is possible. For example, for a citric acid solution concentration of 50 wt %, by establishing a ratio between 50 wt % citric acid solution and 30 wt % hydrogen peroxide solution of 5:1 to 6:1, it is possible to perform selective etching between $Al_{0.2}Ga_{0.8}As$ and $Al_{0.7}Ga_{0.3}As$.

By doing the above, after the formation of an n-type GaAs emitter contact layer 27 and an n-type $Al_{0.2}Ga_{0.8}As$ emitter layer 26, the exposed $Al_{0.7}Ga_{0.3}As$ layer 5 is selectively removed. In this etching, hydrochloric acid (HCl) or buffered fluoric acid or the like is used as an etching fluid for acid treatment (FIG. 2(a)).

Finally, a conventional process is used to form an n-type GaAs sub-collector layer 22, an n-type GaAs collector layer 23, a p-type GaAs base layer 24, an emitter electrode 29, a base electrode 30, and a collector electrode 31, thereby completing the transistor (FIG. 2(b)).

A hetero-junction bipolar transistor fabricated by the method according to the present invention has a number of features. Firstly, by removing the emitter layer 6 using selective wet etching, base surface is exposed without etching damage, thereby enabling the achievement of a base having the desired base resistance and good repeatability. Another feature is that anisotropic wet etching provides good dimensional control of the emitter, without etching damage. Yet another feature of the present invention is that, by using an etching stopper having a high aluminum content, it is possible to perform selective removal of the exposed stopper layer.

What is claimed is:

1. A method for fabricating a hetero-junction bipolar transistor comprising the steps of:

a first step of forming an n-type GaAs sub-collector layer, an n-type GaAs collector layer, a p-type GaAs base layer, an undoped $Al_xGa_{1-x}As$ stopper layer with a value X of 0.7 to 1.0, an n-type $Al_YGa_{1-Y}As$ emitter layer with a value Y of 0 to 0.4, an n-type GaAs emitter contact layer on a semi-insulating GaAs substrate in this sequence;

a second step of forming a resist layer on said n-type GaAs emitter contact layer and patterning said resist layer;

a third step of etching said n-type GaAs emitter contact layer and said n-type $Al_YGa_{1-Y}As$ emitter layer using said resist layer and a first etching fluid with said undoped $Al_xGa_{1-x}As$ stopper layer as an etching stopper, so as to form an n-type GaAs emitter contact and an n-type $Al_YGa_{1-Y}As$ emitter, and expose a surface of said undoped $Al_xGa_{1-x}As$ stopper layer; and a fourth step of removing said exposed undoped $Al_xGa_{1-x}As$ A stopper layer so as to expose a surface of said p-type GaAs base layer using a second etching fluid.

2. A method for manufacturing a hetero-junction bipolar transistor according to claim 1, wherein said first etching fluid is a mixture of a citric acid aqueous solution and hydrogen peroxide aqueous solution, and when a concentration of said hydrogen peroxide aqueous solution is 28 to 32 percent by weight, and a concentration of said citric acid aqueous solution is 20 to 50 percent by weight, a mixture ratio of said citric acid aqueous solution for said hydrogen peroxide aqueous solution is in the range from 2.0 to 6.0.

3. A method for manufacturing a semiconductor device according to claim 2, wherein said second etching fluid is either hydrochloric acid or buffered fluoric acid.

* * * * *